(12) United States Patent
Lim et al.

(10) Patent No.: US 10,580,902 B2
(45) Date of Patent: Mar. 3, 2020

(54) TRANSISTOR, THIN FILM TRANSISTOR ARRAY PANEL, AND RELATED MANUFACTURING METHOD

(71) Applicant: Samsung Display Co., Ltd., Yongin-si, Gyeonggi-do (KR)

(72) Inventors: Ji Hun Lim, Hwaseong-si (KR); Joon Seok Park, Yongin-si (KR); Jay Bum Kim, Seoul (KR); Jun Hyung Lim, Seoul (KR); Kyoung Seok Son, Seoul (KR)

(73) Assignee: Samsung Display Co., Ltd. (KR)

( * ) Notice: Subject to any disclaimer, the term of this patent is extended or adjusted under 35 U.S.C. 154(b) by 3 days.

(21) Appl. No.: 15/691,207

(22) Filed: Aug. 30, 2017

(65) Prior Publication Data

US 2018/0069132 A1  Mar. 8, 2018

(30) Foreign Application Priority Data

Sep. 5, 2016  (KR) .................. 10-2016-0114087

(51) Int. Cl.
*H01L 29/786* (2006.01)
*H01L 27/12* (2006.01)
*H01L 29/66* (2006.01)
*H01L 29/423* (2006.01)

(52) U.S. Cl.
CPC ...... *H01L 29/78648* (2013.01); *H01L 27/127* (2013.01); *H01L 27/1225* (2013.01);
(Continued)

(58) Field of Classification Search
CPC ............... H01L 29/786; H01L 29/7869; H01L 29/78648; H01L 29/78621;
(Continued)

(56) References Cited

U.S. PATENT DOCUMENTS 6,534,788 B1 *  3/2003  Yeo .................. H01L 29/41733
257/66
8,704,232 B2    4/2014  Roudbari et al.
(Continued)

FOREIGN PATENT DOCUMENTS

| KR | 10-0667934 B1 | 1/2007 |
| KR | 10-1239889 B1 | 3/2013 |
| KR | 10-1258474 B1 | 4/2013 |

OTHER PUBLICATIONS

Münzenrieder et al., Flexible Self-Aligned Double-Gate IGZO TFT, IEEE Electron Device Letters, Jan. 2014, pp. 69-71, vol. 35, No. 1.
(Continued)

*Primary Examiner* — Chuong A Luu
(74) *Attorney, Agent, or Firm* — Innovation Counsel LLP

(57) ABSTRACT

A transistor may include a semiconductor, a source electrode, a drain electrode, and a gate electrode. The semiconductor may include a first doped region, a second doped region, a source region, a drain region, and a channel region. The channel region is positioned between the source region and the drain region. The first doped region is positioned between the channel region and the source region. The second doped region is positioned between the channel region and the drain region. A doping concentration of the first doped region is lower than a doping concentration of the source region. A doping concentration of the second doped region is lower than a doping concentration of the drain region. The source electrode is electrically connected to the source region. The drain electrode is electrically connected to the drain region. The gate electrode overlaps the channel region.

10 Claims, 13 Drawing Sheets

(52) U.S. Cl.
CPC .. *H01L 29/42384* (2013.01); *H01L 29/66969* (2013.01); *H01L 29/7869* (2013.01); *H01L 29/78621* (2013.01); *H01L 29/78633* (2013.01); *H01L 2029/42388* (2013.01)

(58) Field of Classification Search
CPC ......... H01L 29/78633; H01L 29/78684; H01L 29/78675; H01L 29/78678; H01L 29/78627; H01L 29/66; H01L 29/66969; H01L 29/66765; H01L 29/66757; H01L 27/12; H01L 27/1225; H01L 27/1288; H01L 27/1222; H01L 27/127; H01L 27/1274; H01L 27/1251; H01L 27/3262
USPC .......................................................... 257/43
See application file for complete search history.

(56) References Cited

U.S. PATENT DOCUMENTS

| | | | |
|---|---|---|---|
| 8,987,027 | B2 | 3/2015 | Yu et al. |
| 9,263,679 | B2 | 2/2016 | You |
| 2005/0037551 | A1 | 2/2005 | Moriguchi et al. |
| 2012/0080663 | A1 | 4/2012 | Lee et al. |
| 2012/0256184 | A1* | 10/2012 | Kaneko ............ H01L 29/78621 257/59 |
| 2015/0187750 | A1 | 7/2015 | Kim et al. |
| 2015/0214248 | A1 | 7/2015 | Chou |
| 2015/0333154 | A1 | 11/2015 | Lee et al. |
| 2015/0364527 | A1 | 12/2015 | Wang et al. |
| 2016/0078809 | A1 | 3/2016 | Yoon et al. |
| 2016/0093647 | A1 | 3/2016 | Kim et al. |
| 2016/0104755 | A1 | 4/2016 | Jin et al. |
| 2016/0133679 | A1 | 5/2016 | Jeon et al. |
| 2018/0033843 | A1* | 2/2018 | Liu .................. G02F 1/133305 |

OTHER PUBLICATIONS

Wu et al., Self-Aligned Top-Gate Coplanar In—Ga—Zn—O Thin-Film Transistors, Journal of Display Technology, Dec. 2009, pp. 515-519, vol. 5, No. 12.

* cited by examiner

TRANSISTOR, THIN FILM TRANSISTOR ARRAY PANEL, AND RELATED MANUFACTURING METHOD

RELATED APPLICATION(S)

This application claims priority to and the benefit of Korean Patent Application No. 10-2016-0114087 filed in the Korean Intellectual Property Office on Sep. 5, 2016; the entire contents of the Korean Patent Application are incorporated herein by reference.

BACKGROUND

1. Field

The technical field relates to a transistor (e.g., a thin film transistor), a thin film transistor array panel, and a manufacturing method of a transistor and/or a thin film transistor array panel.

2. Description of the Related Art

A thin film transistor (TFT) may be used in an electronic devices, such as a display device. The TFT may include a gate electrode connected to a gate line for transmitting a scanning signal, a source electrode connected to a data line for transmitting a signal to a pixel electrode, a drain electrode facing the source electrode, and a semiconductor electrically connected to each of the source electrode and the drain electrode.

The above information disclosed in this Background section is for enhancement of understanding of the background of the described technology. The Background section may contain information that does not form the prior art that is already known in this country to a person of ordinary skill in the art.

SUMMARY

Embodiments may be related to a transistor (e.g., a thin film transistor), a thin film transistor array panel, and a manufacturing method of a transistor and/or a transistor panel. Embodiments may prevent or minimize undesirable current decrease in a lightly doped region of a transistor.

An embodiment may be related to a thin film transistor array panel that includes the following elements: a substrate; a lower gate electrode positioned on the substrate and including polysilicon; a semiconductor positioned on the lower gate electrode and including a channel region, a source region and a drain region respectively positioned at opposite sides of the channel region, a first lightly doped region positioned between the channel region and the source region, and a second lightly doped region positioned between the channel region and the drain region; an upper gate electrode positioned on the semiconductor; a source electrode connected to the source region of the semiconductor; and a drain electrode connected to the drain region of the semiconductor.

The thin film transistor array panel may further include a gate insulating layer positioned between the semiconductor and the upper gate electrode, wherein a width of the gate insulating layer may be wider than that of the upper gate electrode.

The semiconductor may include an oxide semiconductor material.

A surface of the semiconductor may be crystallized.

The thin film transistor array panel may further include: a passivation layer positioned on the semiconductor and the upper gate electrode; a first contact hole formed in the passivation layer to overlap the source region of the semiconductor; a second contact hole formed in the passivation layer to overlap the drain region of the semiconductor; a first dummy hole formed in the passivation layer to overlap the first lightly doped region of the semiconductor; and a second dummy hole formed in the passivation layer to overlap the second lightly doped region of the semiconductor.

The source electrode may be connected to the source region of the semiconductor through the first contact hole, and the drain electrode may be connected to the drain region of the semiconductor through the second contact hole.

The first and second lightly doped regions may be positioned adjacent to the surface of the semiconductor.

An embodiment may be related to a thin film transistor array panel that includes the following elements: a substrate; a semiconductor positioned on the substrate and including a channel region, a source region and a drain region respectively positioned at opposite sides of the channel region, a first lightly doped region positioned between the channel region and the source region, and a second lightly doped region positioned between the channel region and the drain region; an upper gate electrode positioned on the semiconductor; a passivation layer positioned on the semiconductor and the upper gate electrode; a first contact hole formed in the passivation layer and exposing the source region of the semiconductor; a second contact hole formed in the passivation layer and exposing the drain region of the semiconductor; a first dummy hole formed in the passivation layer and exposing the first lightly doped region of the semiconductor; a second dummy hole formed in the passivation layer and exposing the second lightly doped region of the semiconductor; a source electrode connected to the source region of the semiconductor through the first contact hole; and a drain electrode connected to the drain region of the semiconductor through the second contact hole.

The first and second lightly doped regions may be positioned adjacent to a surface of the semiconductor.

The semiconductor may be made of an oxide semiconductor material, and the surface of the semiconductor may be crystallized.

An embodiment may be related to a manufacturing method of a thin film transistor array panel. The method may include the following steps: forming a lower gate electrode on a substrate through a low temperature polysilicon process; forming a semiconductor on the lower gate electrode; forming an upper gate electrode on the semiconductor; forming a channel region that is not doped, source and drain regions that are doped at a high concentration, and first and second lightly doped regions that that are doped at a low concentration by doping an impurity in the semiconductor; forming a source electrode connected to the source region of the semiconductor; and forming a drain electrode connected to the drain region of the semiconductor.

The manufacturing method of the thin film transistor array panel may further include forming a gate insulating layer on the semiconductor, wherein a width of the gate insulating layer may be wider than that of the upper gate electrode, the channel region may overlap the upper gate electrode and the gate insulating layer, and the first and second lightly doped regions may overlap the gate insulating layer.

The semiconductor may include an oxide semiconductor material.

The surface of the semiconductor may be crystallized.

The manufacturing method of the thin film transistor array panel may further include: forming a passivation layer on the semiconductor and the upper gate electrode; forming a first dummy hole and a second dummy hole in the passivation layer to be adjacent to the upper gate electrode; and performing an oxygen plasma process or a heat treatment process under an oxygen atmosphere to portions of the semiconductor exposed through the first dummy hole and the second dummy hole.

The manufacturing method of the thin film transistor array panel may further include forming a first contact hole in the passivation layer to overlap the source region of the semiconductor, and forming a second contact hole in the passivation layer to overlap the drain region of the semiconductor, wherein the source electrode may be connected to the source region through the first contact hole, and the drain electrode may be connected to the drain region through the second contact hole.

The first and second lightly doped regions of the semiconductor may be expanded by the oxygen plasma process or the heat treatment process under the oxygen atmosphere.

An embodiment may be related to a manufacturing method of a thin film transistor array panel. The method may include the following steps: forming a semiconductor on a substrate; forming an upper gate electrode on the semiconductor; forming a channel region that is not doped and source and drain regions that are doped at a high concentration by doping an impurity in the semiconductor; forming a passivation layer on the semiconductor and the upper gate electrode; forming a first dummy hole and a second dummy hole in the passivation layer to be adjacent to the upper gate electrode; forming first and second lightly doped regions that are doped at a low concentration by performing an oxygen plasma process or a heat treatment process under an oxygen atmosphere to portions of the semiconductor exposed through the first dummy hole and the second dummy hole; forming a first contact hole in the passivation layer to overlap the source region of the semiconductor; forming a second contact hole in the passivation layer to overlap the drain region of the semiconductor; forming a source electrode connected to the source region of the semiconductor through the first contact hole on the passivation layer; and forming a drain electrode connected to the drain region of the semiconductor through the second contact hole on the passivation layer.

The first lightly doped region may be positioned between the channel region and the source region, the second lightly doped region may be positioned between the channel region and the drain region, and the first and second lightly doped regions may be positioned adjacent to the surface of the semiconductor.

The first dummy hole, the second dummy hole, the first contact hole, and the second contact hole may be simultaneously formed in the passivation layer.

An embodiment may be related to a transistor, e.g., a thin film transistor. The transistor may include a semiconductor, a source electrode, a drain electrode, and a first gate electrode. The semiconductor may include a first doped region, a second doped region, a source region, a drain region, and a channel region. The channel region may be positioned between the source region and the drain region. The first doped region may be positioned between the channel region and the source region. The second doped region may be positioned between the channel region and the drain region. A doping concentration of the first doped region may be lower than a doping concentration of the source region and may be greater than 0 (and may be greater than a doping concentration of the channel region). A doping concentration of the second doped region may be lower than a doping concentration of the drain region and may be greater than 0 (and may be greater than the doping concentration of the channel region). The source electrode may be electrically connected to the source region. The drain electrode may be electrically connected to the drain region. The first gate electrode may overlap the channel region.

The transistor may include a substrate. The first gate electrode may be positioned between the substrate and the semiconductor. A minimum distance between the substrate and the first doped region may be greater than a minimum distance between the substrate and the source region.

The transistor may include a substrate. The first gate electrode may be positioned between the substrate and the semiconductor. A minimum distance between the substrate and the channel region may be greater than a minimum distance between the substrate and the first doped region. The minimum distance between the substrate and the first doped region may be greater than a minimum distance between the substrate and the source region. A minimum distance between the substrate and the second doped region may be greater than a minimum distance between the substrate and the drain region.

The first gate electrode may directly contact the substrate and may be formed of polysilicon.

The transistor may include a second gate electrode and a gate insulating layer. The channel region may be positioned between the first gate electrode and the second gate electrode. The gate insulating layer may be positioned between the channel region and the first gate electrode and may directly contact at least one of the first doped region and the second doped region.

The transistor may a gate insulating layer. The gate insulating layer may be positioned between the channel region and the first gate electrode and may directly contact at least one of the first doped region and the second doped region.

The gate insulating layer may not directly contact the source region and may not directly contact the drain region.

The gate insulating layer may directly contact each of the first doped region, the second doped region, and the channel region.

The transistor may include a gate insulating layer and a passivation layer. The gate insulating layer may be positioned between the channel region and the first gate electrode. The passivation layer may directly contact the semiconductor and may directly contact at least three faces of the gate insulating layer.

The transistor may include a gate insulating layer and a passivation layer. The gate insulating layer may be positioned between the channel region and the first gate electrode. A face of the gate insulating layer may directly contact the first gate electrode. The passivation layer may directly contact the face of the gate insulating layer.

The transistor may include a passivation layer. The passivation layer may directly contact at least one of the first doped region and the second doped region.

A first hole may extend through the passivation layer and may expose the first doped region. A second hole may extend through the passivation layer and may expose the second doped region.

The transistor may include a passivation layer. The passivation layer may directly contact at least one of the source region and the drain region. A first hole may extend through the first passivation layer and may expose the first doped region. A second hole extends through the first passivation layer and may expose the second doped region.

A first face of the channel region may be positioned between the first gate electrode and a second face of the channel region. A first direction may be perpendicular to the first face of the channel region. A thickness of the first doped region in the first direction may be less than a thickness of the source region in the first direction. A thickness of the second doped region in the first direction may be less than a thickness of the drain region in the first direction.

An embodiment may be related to a method for manufacturing a transistor. The method may include the following steps: preparing a semiconductor; forming a first doped region, a second doped region, a source region, a drain region, and a channel region in the semiconductor, wherein the channel region is positioned between the source region and the drain region, wherein the first doped region is positioned between the channel region and the source region, wherein the second doped region is positioned between the channel region and the drain region, wherein a doping concentration of the first doped region is lower than a doping concentration of the source region and is greater than 0, and wherein a doping concentration of the second doped region is lower than a doping concentration of the drain region and is greater than 0; forming a source electrode, which is electrically connected to the source region; forming a drain electrode, which is electrically connected to the drain region; and forming a first gate electrode, wherein the first gate electrode and the channel region overlap each other.

The method may include the following steps: providing a gate insulating layer on the semiconductor; providing the first gate electrode on the gate insulating layer; and doping the semiconductor to form the first doped region, the second doped region, the source region, the drain region, and the channel region. Both a first portion of the semiconductor and a second portion of the semiconductor may be covered by the gate insulating layer without being covered by the first gate electrode during the doping. A third portion of the semiconductor may be covered by both the gate insulating layer and the first gate electrode during the doping. The first doped region may be formed at the first portion of the semiconductor. The second doped region may be formed at the second portion of the semiconductor. The channel region may be formed at the third portion of the semiconductor.

The method may include the following step: providing a second gate electrode before providing the semiconductor. Two edges of the gate insulating layer may overlap the second gate electrode without overlapping the second gate electrode.

The method may include the following steps: providing a passivation layer on the semiconductor; forming two process holes through the passivation layer to expose two doped portions of the semiconductor; performing at least one of a plasma process and a heat treatment through the two process holes on the two doped portions of the semiconductor to form the first doped region and the second doped region.

The plasma process and/or the heat treatment may cause doping concentration reduction of the two doped portions of the semiconductor and/or widening of the two doped portions of the semiconductor.

The method may include the following steps: forming a first contact hole and a second contact hole through the passivation layer after the at least one of the plasma process and the heat treatment has been performed; positioning a portion of the source electrode inside the first contact hole; and positioning a portion of the drain electrode inside the second contact hole.

The method may include the following steps: forming a first contact hole and a second contact hole through the passivation layer when forming the two process holes; positioning a portion of the source electrode inside the first contact hole; and positioning a portion of the drain electrode inside the second contact hole.

According to embodiments, undesirable current decrease in a transistor, e.g., in a lightly doped region of a transistor, may be prevented or minimized.

DETAILED DESCRIPTION

Figure 1:
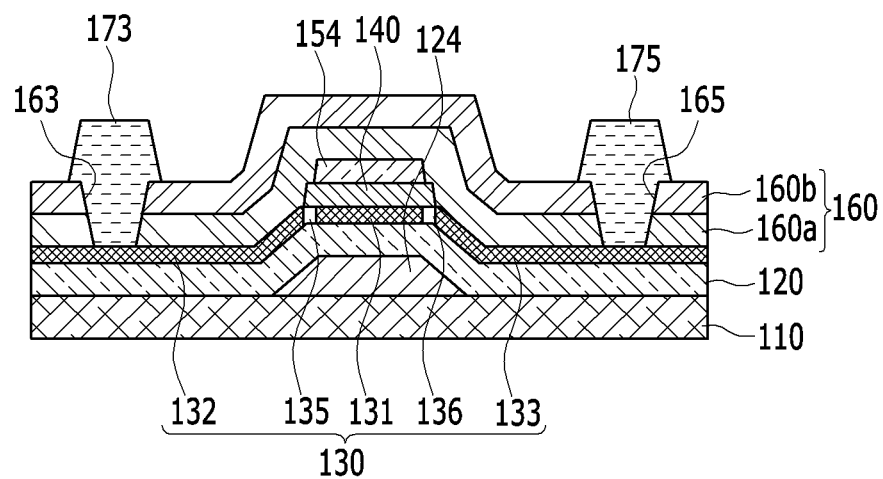
FIG. 1 illustrates a cross-sectional view of a thin film transistor array panel according to an embodiment.

Embodiments are described with reference to the accompanying drawings. As those skilled in the art would realize, the described embodiments may be modified in various different ways.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Like reference numerals may designate like elements throughout the specification.

In the drawings, thicknesses of layers, films, panels, regions, etc., may be exaggerated for clarity.

When a first element (such as a layer, film, region, or substrate) is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and the second element.

Unless explicitly described to the contrary, the word "comprise" and variations such as "comprises" or "comprising" may imply the inclusion of stated elements but not the exclusion of any other elements.

FIG. 1 illustrates a cross-sectional view of a thin film transistor array panel according to an embodiment.

As shown in FIG. 1, the thin film transistor array panel includes a substrate 110 and a lower gate electrode 124 positioned on the substrate 110.

The substrate 110 may be made of an insulating material such as at least one of glass, a polymer, and stainless steel. The substrate 110 may have a flat plate shape, and it is flexible, stretchable, foldable, bendable, and/or rollable.

The lower gate electrode 124 may include and/or may be formed of polysilicon.

A first gate insulating layer 120 is positioned on the lower gate electrode 124 and the substrate 110. The first gate insulating layer 120 may be made of an insulating material such as at least one of silicon oxide (SiOx), aluminum oxide (AlOx), and the like. The first gate insulating layer 120 may be formed as a single layer or a multilayer.

A semiconductor 130 is positioned on the first gate insulating layer 120. The semiconductor 130 overlaps the lower gate electrode 124. The semiconductor 130 may be made of an oxide semiconductor material. For example, the oxide semiconductor material may be made of an oxide of a metal such as zinc (Zn), indium (In), gallium (Ga), tin (Sn), titanium (Ti), or another material, or a combination of metals such as a combination of some of zinc (Zn), indium (In), gallium (Ga), tin (Sn), titanium (Ti), and oxides of some metals. In an embodiment, the oxide semiconductor material may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or another material. The semiconductor 130 may have layers that are stacked, and an uppermost layer of the semiconductor 130 may be crystallized. In an embodiment, a surface of the semiconductor 130 may be crystallized.

The semiconductor 130 may include a channel region 131, a source region 132 and a drain region 133 positioned at opposite sides of the channel region 131, a first lightly doped region 135 positioned between the channel region 131 and the source region 132, and a second lightly doped region 136 positioned between the channel region 131 and the drain region 133. An impurity is doped at a high concentration in the source region 132 and the drain region 133, and an impurity is doped at a low concentration in the first lightly doped region 135 and the second lightly doped region 136.

A second gate insulating layer 140 is positioned on the semiconductor 130. The second gate insulating layer 140 may be made of an inorganic insulating material such as a silicon nitride (SiNx), a silicon oxide (SiOx), or another material. The second gate insulating layer 140 may have a single layer structure or a multilayer structure.

An upper gate electrode 154 is positioned on the second gate insulating layer 140. The upper gate electrode 154 may be made of a low resistance metal material such as gold, silver, copper, nickel, aluminum, molybdenum, etc., or of an alloy thereof.

A width of the second gate insulating layer 140 may be larger than that of the upper gate electrode 154. The second gate insulating layer 140 may overlap the channel region 131, the first lightly doped region 135, and the second lightly doped region 136 of the semiconductor 130. The upper gate electrode 154 may overlap the channel region 131 of the semiconductor 130. The second gate insulating layer 140 may not overlap the source region 132 and the drain region 133 of the semiconductor 130. The upper gate electrode 154 may not overlap the source region 132, the drain region 133, the first lightly doped region 135, and the second lightly doped region 136 of the semiconductor 130.

A passivation layer 160 is positioned on the semiconductor 130, the second gate insulating layer 140, and the upper gate electrode 154. The passivation layer 160 includes a first passivation layer 160a and a second passivation layer 160b. The first passivation layer 160a may be made of a silicon nitride (SiNx), and it may include double layers where a silicon oxide (SiOx) is positioned on the silicon nitride (SiNx). The second passivation layer 160b may be positioned on the first passivation layer 160a. The second passivation layer 160b may be made of a silicon nitride (SiNx), an aluminum oxide (AlOx), or another material.

A first contact hole 163 is formed in the passivation layer 160 to overlap the source region 132 of the semiconductor 130, and a second contact hole 165 is formed in the passivation layer 160 to overlap the drain region 133 of the semiconductor 130.

A source electrode 173 and a drain electrode 175 may be positioned on the passivation layer 160. The source electrode 173 is connected to the source region 132 of the semiconductor 130 through the first contact hole 163, and the drain electrode 175 is connected to the drain region 133 of the semiconductor 130 through the second contact hole 165.

As such, the semiconductor 130, the upper gate electrode 154, the source electrode 173, and the drain electrode 175 form a thin film transistor. The thin film transistor array panel may include a plurality of pixels and a driving portion for driving the plurality of pixels. The thin film transistor described above may be used as a switching element directly connected to each pixel, or as a switching element included in the driving portion.

The semiconductor 130 of the thin film transistor may be made of an oxide semiconductor material, and when it is used as the switching element included in the driving portion, a high voltage (Vds) may be applied to the semiconductor 130. In the semiconductor 130 of the thin film transistor, the first lightly doped region 135 is disposed between the channel region 131 and the source region 132, and the second lightly doped region 136 is disposed between the channel region 131 and the drain region 133. Accordingly, a doping concentration may be slowly changed in the semiconductor 130, thereby preventing an electric field from being rapidly changed. In an embodiment, since the lower gate electrode 124 is positioned below the semiconductor 130, an undesirable current decrease in the first lightly doped region 135 and the second lightly doped region 136 may be prevented.

The lower gate electrode 124 may overlap the channel region 131 of the semiconductor 130, and it may also overlap the first lightly doped region 135 and the second lightly doped region 136. The lower gate electrode 124 is connected to the upper gate electrode 154 such that the same gate voltage may be applied to both the upper gate electrode 154 and the lower electrode 124. Thus a current amount and current mobility may increase in the semiconductor 130 of the thin film transistor. The lower gate electrode 124 may be connected to the source electrode 173 instead of the upper gate electrode 154.

The lower gate electrode 124 may be made of polysilicon, and since the polysilicon has a low band gap, it may absorb photons in a main wavelength bandwidth that may affect reliability of the thin film transistor. Accordingly, when the thin film transistor array panel is used in a liquid crystal display, the lower gate electrode 124 may serve to block light of a backlight emitted from a lower portion of the thin film transistor array panel.

FIG. 2 to FIG. 8 illustrate cross-sectional views of structures formed in a manufacturing method of a thin film transistor array panel according to an embodiment.

Figure 2:
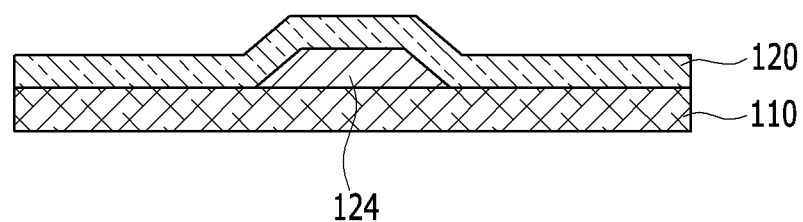
FIG. 2, FIG. 3, FIG. 4, FIG. 5, FIG. 6, FIG. 7, and FIG. 8 illustrate cross-sectional views of structures formed in a manufacturing method of a thin film transistor array panel according to an embodiment.

Referring to FIG. 2, the lower gate electrode 124 is formed on the substrate 110 through a low temperature polysilicon (LTPS) process.

Subsequently, an insulating material such as at least one of silicon oxide (SiOx), aluminum oxide (AlOx), etc. is deposited and patterned on the substrate 110 and the lower gate electrode 124, thus the first gate insulating layer 120 is formed.

Figure 3:
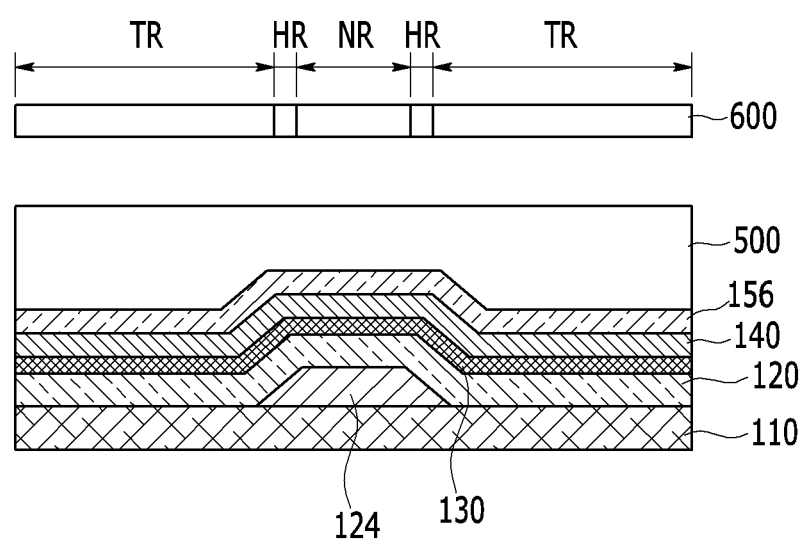

Referring to FIG. 3, the semiconductor 130 is formed on the first gate insulating layer 120, and in an embodiment, an oxide semiconductor material is used. The semiconductor 130 may have layers that are stacked, and an uppermost layer of the semiconductor 130 may be crystallized. In an embodiment, a surface of the semiconductor 130 may be crystallized.

A silicon nitride (SiNx) layer and/or a silicon oxide (SiOx) layer is deposited and patterned on the semiconductor 130, such that the second gate insulating layer 140 is formed. An upper gate metal layer 156 is formed on the second gate insulating layer 140 using a metal material. A photoresist 500 is coated on the upper gate metal layer 156.

A mask 600 is provided to correspond to the photoresist 500, and then an exposure process is performed. The mask 600 may be formed as a slit mask or a half tone mask. The mask 600 includes a non-transmissive region (NR) blocking most of light, a half-transmissive region (HR) blocking some of light and allowing the remaining light to be transmitted, and a transmissive region (TR) allowing most of light to be transmitted. When the mask 600 is a slit mask, the half-transmissive region (HR) may have a slit shape.

The non-transmissive region (NR) substantially corresponds to a central portion of the lower gate electrode 124, the half-transmissive region (HR) substantially corresponds to an edge or peripheral area of the lower gate electrode 124, and the transmissive region (TR) substantially corresponds to left and right portions of the lower gate electrode 124. In an embodiment, the transmissive regions (TR) are positioned on opposite sides of the non-transmissive region (NR), and the half-transmissive regions (HR) are positioned between the non-transmissive region (NR) and the transmissive regions (TR).

A portion of the photoresist 500 corresponding to the non-transmissive region (NR) of the mask 600 is not substantially exposed to light, a portion of the photoresist 500 corresponding to the half-transmissive region (HR) of the mask 600 is exposed to some of light, and a portion of the photoresist 500 corresponding to the transmissive region (TR) of the mask 600 is exposed to most of light.

Figure 4:
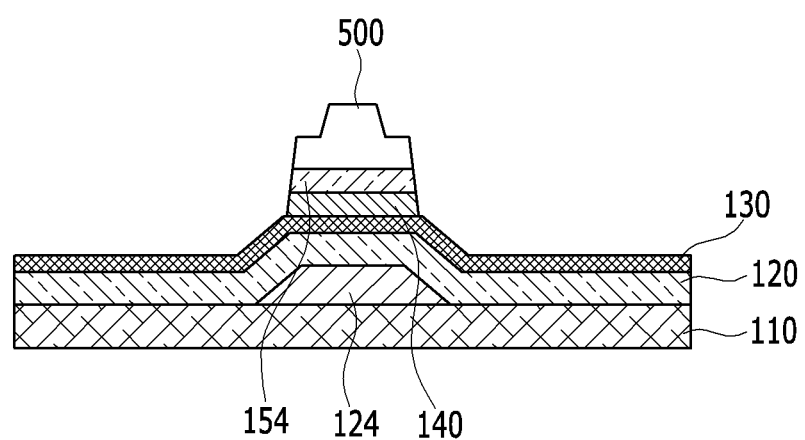

Referring to FIG. 4, the photoresist 500 to which the exposure process is performed is developed to be patterned. When the photoresist 500 is a positive photoresist, a portion that is exposed to light is eliminated, a portion that is partially exposed to light is thinned, and a portion that is not exposed to light remains. In an embodiment, the photoresist 500 is divided by two portions having different thicknesses. In an embodiment, the photoresist 500 may be a negative photoresist. In the mask 600, the non-transmissive region may be changed to the transmissive region, and the transmissive region may be changed to the non-transmissive region.

Subsequently, the upper gate electrode 154 and the second gate insulating layer 140 are patterned using the patterned photoresist 500 as a mask. In an embodiment, a width of the upper gate electrode 154 is the same as that of the second gate insulating layer 140.

Figure 5:
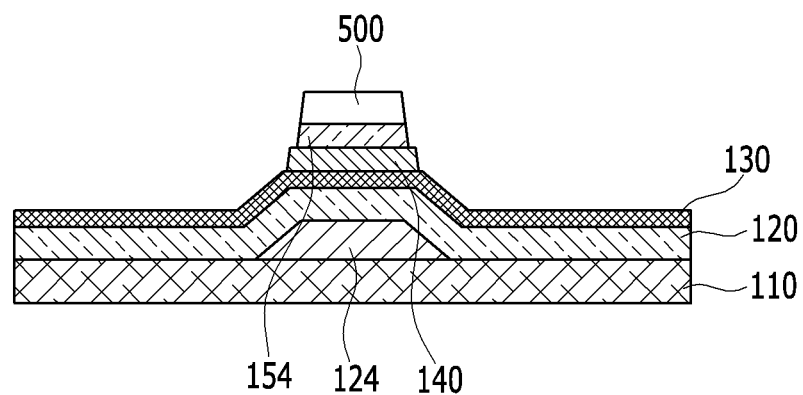

Referring to FIG. 5, a thickness of the patterned photoresist 500 is reduced through an ashing process. A portion of the photoresist 500 having a relatively thin thickness is eliminated, and a portion of the photoresist 500 having a relatively thick thickness becomes thin.

Next, the upper gate electrode 154 is patterned using the photoresist 500 to which the ashing process is performed as a mask. In an embodiment, a width of the upper gate electrode 154 decreases, and a width of the second gate insulating layer 140 becomes wider than that of the upper gate electrode 154.

Figure 6:
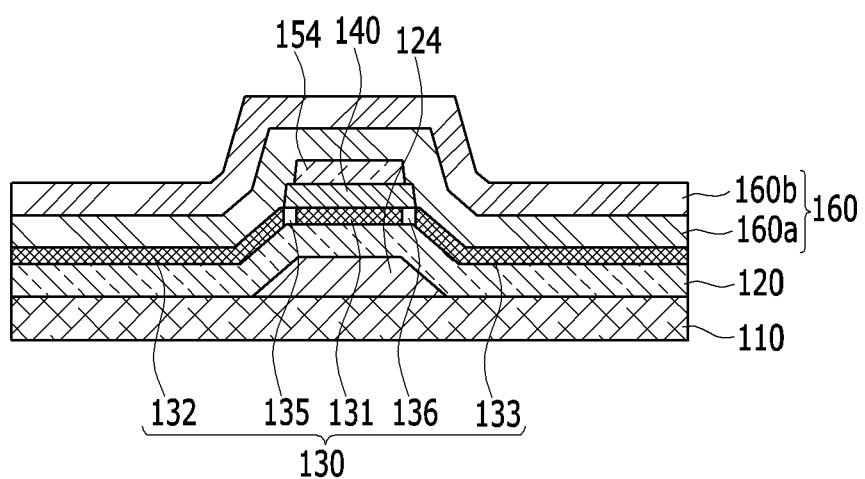

Next, after impurity is doped in the semiconductor 130 using the upper gate electrode 154 as a mask, referring to FIG. 6, the channel region 131, the source region 132, the drain region 133, the first lightly doped region 135, and the second lightly doped region 136 are formed in the semiconductor 130. The remaining part of the photoresist 500 is entirely eliminated.

The channel region 131 may overlap the upper gate electrode 154 and the second gate insulating layer 140. The channel region 131 may be blocked by the upper gate electrode 154 and the second gate insulating layer 140 to not be substantially doped. The channel region 131 may overlap the lower gate electrode 124.

The first lightly doped region 135 and the second lightly doped region 136 may overlap the second gate insulating layer 140, and may not overlap the upper gate electrode 154. The first lightly doped region 135 and the second lightly doped region 136 are not blocked by the upper gate electrode 154, but they are partially blocked by the second gate insulating layer 140 to be doped at a low concentration. The first lightly doped region 135 and the second lightly doped region 136 may overlap the lower gate electrode 124. The first lightly doped region 135 and the second lightly doped region 136 may be positioned at opposite sides of the channel region 131.

The source region 132 and the drain region 133 may not overlap the upper gate electrode 154 and the second gate insulating layer 140. The source region 132 and the drain region 133 may be doped at a high concentration. The source region 132 may be adjacent to the first lightly doped region 135, and the drain region 133 may be adjacent to the second lightly doped region 136. The first lightly doped region 135 may be positioned between the channel region 131 and the source region 132, and the second lightly doped region 136 may be positioned between the channel region 131 and the drain region 133.

Next, the passivation layer 160 is formed on the semiconductor 130 and the upper gate electrode 154. The passivation layer 160 may include the first passivation layer 160a and the second passivation layer 160b. First, a silicon nitride (SiNx) layer is deposited on the semiconductor 130 and the upper gate electrode 154 to form the first passivation layer 160a. In an embodiment, the first passivation layer 160a may be formed by continuously depositing a silicon nitride (SiNx) layer and/or a silicon oxide (SiOx) layer. By depositing an insulating material such as silicon nitride (SiNx), aluminum oxide (AlOx), or another material on the first passivation layer 160a, the second passivation layer 160b is formed.

Figure 7:
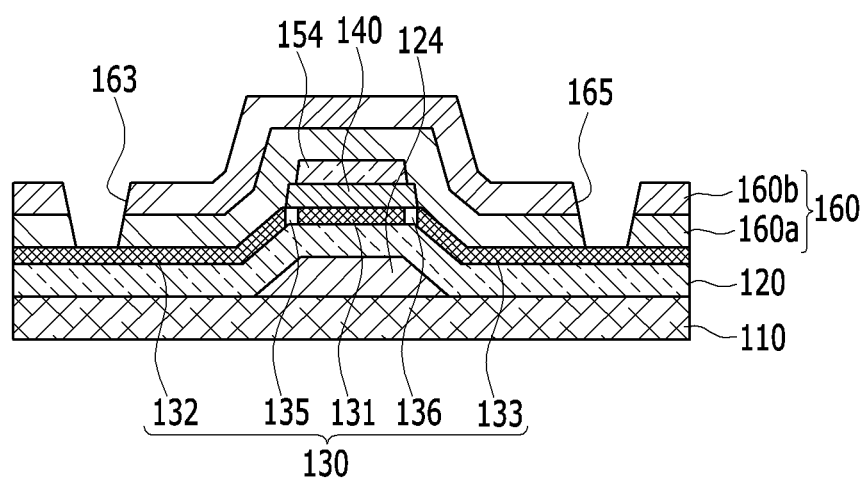

As shown in FIG. 7, the first contact hole 163 is provided in the passivation layer 160 to expose the source region 132 of the semiconductor 130, and the second contact hole 165 is provided in the passivation layer 160 to expose the drain region 133 of the semiconductor 130. An upper surface of the source region 132 of the semiconductor 130 is partially exposed by the first contact hole 163, and an upper surface of the drain region 133 of the semiconductor 130 is partially exposed by the second contact hole 165.

Figure 8:
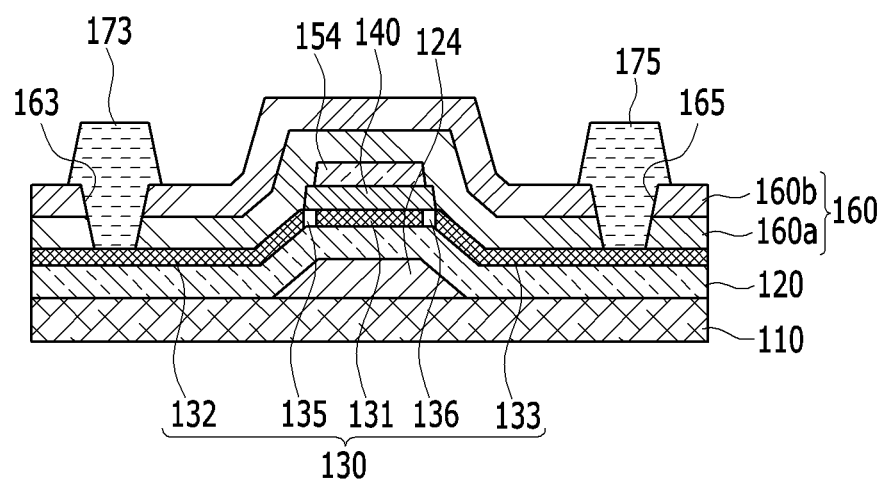

Referring to FIG. 8, by depositing and patterning the metal material on the passivation layer 160, the source electrode 173 and drain electrode 175 are formed. The source electrode 173 is connected to the source region 132 of the semiconductor 130 through the first contact hole 163, and the drain electrode 175 is connected to the drain region 133 of the semiconductor 130 through the second contact hole 165.

Recently, a thin film transistor array panel that is provided with both a thin film transistor including a semiconductor made of polysilicon and a thin film transistor including a semiconductor made of an oxide semiconductor material has been under development. In a case of such a thin film transistor array panel, since a lower gate electrode of the thin film transistor including the semiconductor made of the oxide semiconductor material is formed together in a process in which the thin film transistor including the semiconductor made of the polysilicon is formed, a process thereof may be simplified.

Hereinafter, a thin film transistor array panel according to an embodiment will be described with reference to FIG. 9.

Some features of a thin film transistor array panel described with reference to FIG. 9 may be identical to or analogous to some features of the thin film transistor array described with reference to FIG. 1.

Figure 9:
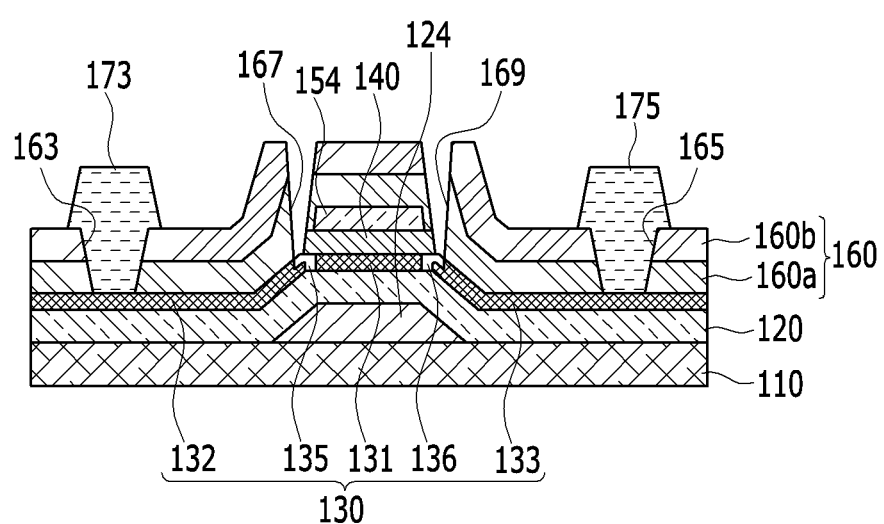
FIG. 9 illustrates a cross-sectional view of a thin film transistor array panel according to an embodiment.

FIG. 9 illustrates a cross-sectional view of a thin film transistor array panel according to an embodiment.

As shown in FIG. 9, a thin film transistor array panel according to an embodiment includes the substrate 110, the lower gate electrode 124 positioned on the substrate 110, the first gate insulating layer 120 positioned on the lower gate electrode 124, the semiconductor 130 positioned on the first gate insulating layer 120, the second gate insulating layer 140 positioned on the semiconductor 130, and the upper gate electrode 154 positioned on the second gate insulating layer 140. The semiconductor 130 includes the channel region 131, the source region 132, the drain region 133, the first lightly doped region 135, and the second lightly doped region 136. The passivation layer 160 positioned on the upper gate electrode 154, and the source electrode 173 and the drain electrode 175 are positioned on the passivation layer 160.

The first contact hole 163 overlapping the source region 132 of the semiconductor 130 and the second contact hole 165 overlapping the drain region 133 of the semiconductor 130 are provided in the passivation layer 160. In an embodiment, a first dummy hole 167 (or first process hole 167) exposing the first lightly doped region 135 of the semiconductor 130 and a second dummy hole 169 (or second process hole 169) exposing the second lightly doped region 136 of the semiconductor 130 are provided in the passivation layer 160.

The first lightly doped region 135 and the second lightly doped region 136 may be positioned adjacent to a surface of the semiconductor 130. In an embodiment, the first lightly doped region 135 and the second lightly doped region 136 may be positioned in an upper portion of the semiconductor 130. In an embodiment, thicknesses of the first lightly doped region 135 and the second lightly doped region 136 in a direction perpendicular to the substrate 110 may be thinner than those of other regions of the semiconductor 130, e.g., thicknesses of the source region 132, the drain region 133, and/or the channel region 131, in the direction perpendicular to the substrate 110. In an embodiment, a portion of the source region 132 may be positioned below the first lightly doped region 135 and/or may be closer to the substrate 110 than the first lightly doped region 135, and a portion of the drain region 133 may be positioned below the second lightly doped region 136 and/or may be closer to the substrate 110 than the second lightly doped region 136. Since the first and second lightly doped regions 135 and 136 of the semiconductor 130 are thinner than other regions of the semiconductor 130, undesirable current decrease in the first lightly doped region 135 and the second lightly doped region 136 may be prevented or minimized.

In an embodiment, by forming the lower gate electrode 124, undesirable decrease of currents in the first lightly doped region 135 and the second lightly doped region 136 may also be prevented or minimized. In an embodiment, since current decrease in the first and second lightly doped regions 135 and 136 may be prevented by adjusting the thicknesses of the first and second lightly doped regions 135 and 136 of the semiconductor 130, the lower gate electrode 124 may be unnecessary.

In an embodiment, the second gate insulating layer 140 may be wider than the upper gate electrode 154. In an embodiment, the second gate insulating layer 140 may have the same width as that of the upper gate electrode 154.

FIG. 10 to FIG. 13 illustrates illustrate cross-sectional views of structures formed in a manufacturing method of a thin film transistor array panel according to an embodiment.

Figure 10:
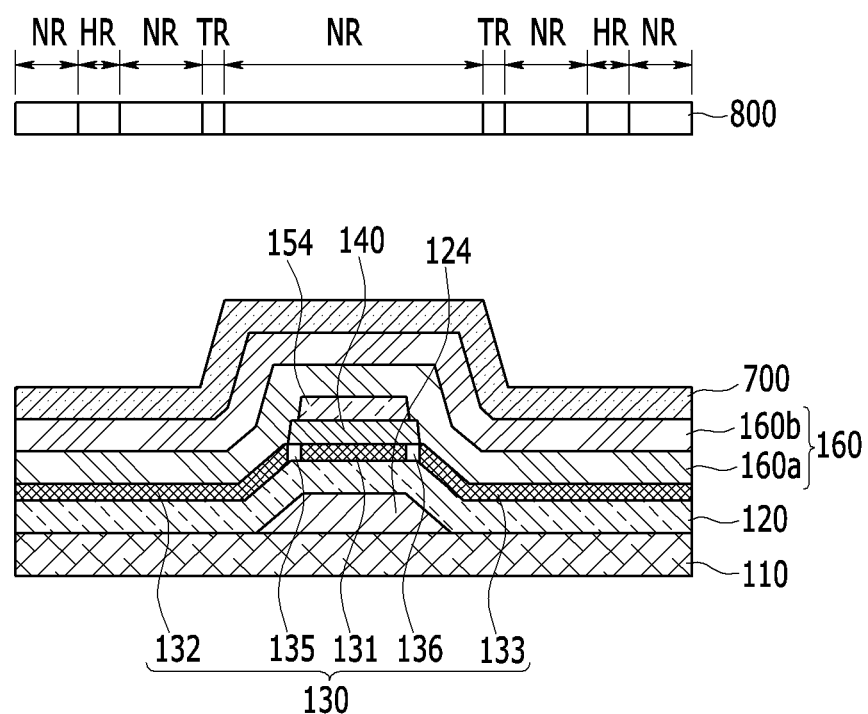
FIG. 10, FIG. 11, FIG. 12, and FIG. 13 illustrate cross-sectional views of structures formed in a manufacturing method of a thin film transistor array panel according to an embodiment.

Referring to FIG. 10, the lower gate electrode 124 is formed on the substrate 110 through a low temperature polysilicon (LTPS) process. As described above, a process for forming the lower gate electrode 124 may be omitted.

Next, the first gate insulating layer 120 is formed on the substrate 110 and the lower gate electrode 124. The semiconductor 130 is formed on the first gate insulating layer 120, and in an embodiment, an oxide semiconductor material is used.

Next, the second gate insulating layer 140 is formed on the semiconductor 130, and the upper gate electrode 154 is formed on the second gate insulating layer 140. In an embodiment, the second gate insulating layer 140 may have a wider width than that of the upper gate electrode 154. In addition, as described above, the second gate insulating layer 140 may have the same width as that of the upper gate electrode 154.

Next, an impurity is doped in the semiconductor 130, such that the channel region 131, the source region 132, the drain region 133, the first lightly doped region 135, and the second lightly doped region 136 are formed. The passivation layer 160 is formed on the semiconductor 130, the second gate insulating layer 140, and the upper gate electrode 154. The passivation layer 160 may include the first passivation layer 160a and the second passivation layer 160b. A photoresist 700 is coated on the passivation layer 160.

A mask 800 is provided to correspond to the photoresist 700, and then an exposure process is performed. The mask 800 may be formed as a slit mask or a half tone mask. The mask 800 includes a non-transmissive region (NR) blocking most of light, a half-transmissive region (HR) blocking some of light and allowing the remaining light to be transmitted, and a transmissive region (TR) allowing most of light to be transmitted.

A portion of the photoresist 700 corresponding to the non-transmissive region (NR) of the mask 800 is not substantially exposed to light, a portion of the photoresist 700 corresponding to the half-transmissive region (HR) of the mask 800 is exposed to some of light, and a portion of the photoresist 700 corresponding to the transmissive region (TR) of the mask 800 is exposed to most of light.

Figure 11:
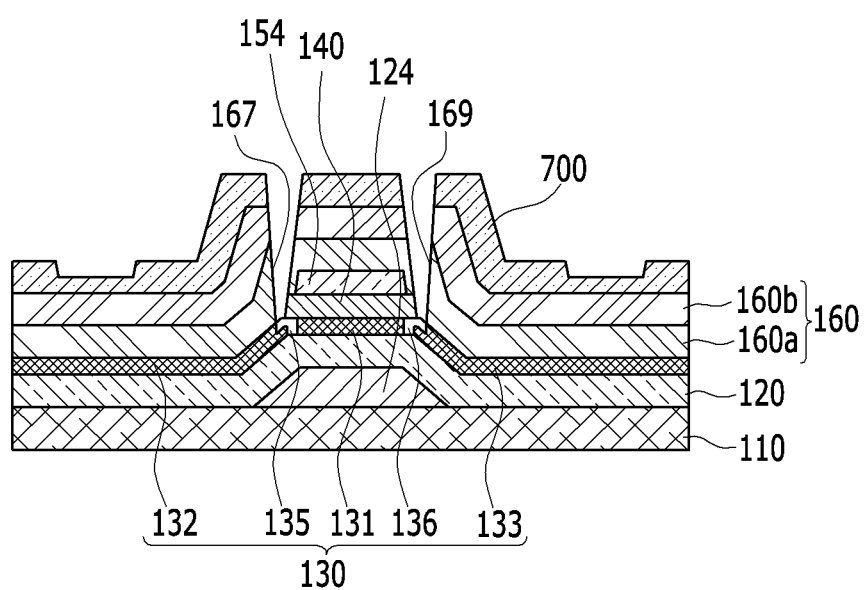

Referring to FIG. 11, the photoresist 700 to which the exposure process is performed is developed to be patterned. When the photoresist 700 is a positive photoresist, a portion that is exposed to light is eliminated, a portion that is partially exposed to light is thinned, and a portion that is not exposed to light remains. In an embodiment, the photoresist 700 is divided by two portions having different thicknesses. In an embodiment, the photoresist 700 may be a negative photoresist. In the mask 800, the non-transmissive region may be changed to the transmissive region, and the transmissive region may be changed to the non-transmissive region.

Next, the passivation layer 160 is patterned using the patterned photoresist 700 as a mask to form the first dummy hole 167 and the second dummy hole 169. The first dummy hole 167 and the second dummy hole 169 are formed to be adjacent to the upper gate electrode 154.

Some region of the semiconductor 130 is exposed through the first dummy hole 167 and the second dummy hole 169. Particularly, a region of the semiconductor 130 that is doped at a high concentration may be exposed. A portion of the semiconductor 130 exposed through the first dummy hole 167 and the second dummy hole 169 is treated by an oxygen plasma process, or is heat-treated under an oxygen atmosphere. Accordingly, a doping concentration of the portion of the semiconductor 130 treated by the oxygen plasma process or heat-treated decreases. Accordingly, the widths of the first and second lightly doped regions 135 and 136 of the typical semiconductor 130 may be widened. The portions of the widened first and second lightly doped regions 135 and 136 are positioned adjacent to the surface of the semiconductor 130. When the oxygen plasma process or the heat treatment process under the oxygen atmosphere is performed, since the lightly doped region may be formed adjacent to the surface of the semiconductor 130, the decrease of the current in the first and second lightly doped regions 135 and 136 may be prevented.

As described above, the second gate insulating layer 140 may have the same width as that of the upper gate electrode 154, and in an embodiment, in the process for doping the impurity in the semiconductor 130, the channel region, the source region, and the drain region are formed, but the lightly doped region is separately formed. Subsequently, the first dummy hole 167 and the second dummy hole 169 are provided in the passivation layer 160, and then it is possible to form a lightly doped region by decreasing a doping concentration of a portion of a heavily doped region through the oxygen plasma process or the heat treatment under the oxygen atmosphere.

Figure 12:
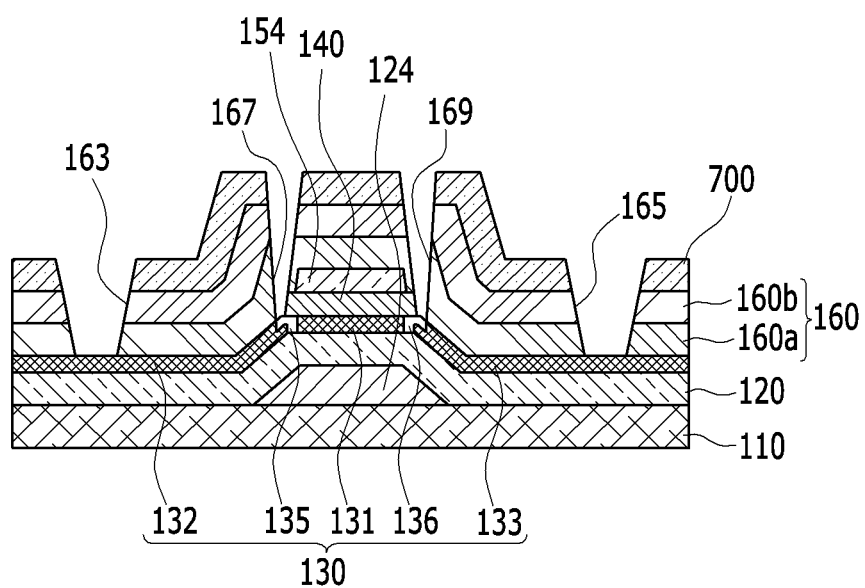

Referring to FIG. 12, a thickness of the patterned photoresist 700 is reduced through the ashing process. A portion of the photoresist 700 having a relatively thin thickness is eliminated, and a portion of the photoresist 700 having a relatively thick thickness becomes thin.

Next, the passivation layer 160 is patterned using the photoresist 700 to which the ashing process is performed as a mask. In an embodiment, in the passivation layer 160, the first contact hole 163 is provided to overlap the source region 132 of the semiconductor 130, and the second contact hole 165 is provided to overlap the drain region 133 of the semiconductor 130.

Figure 13:
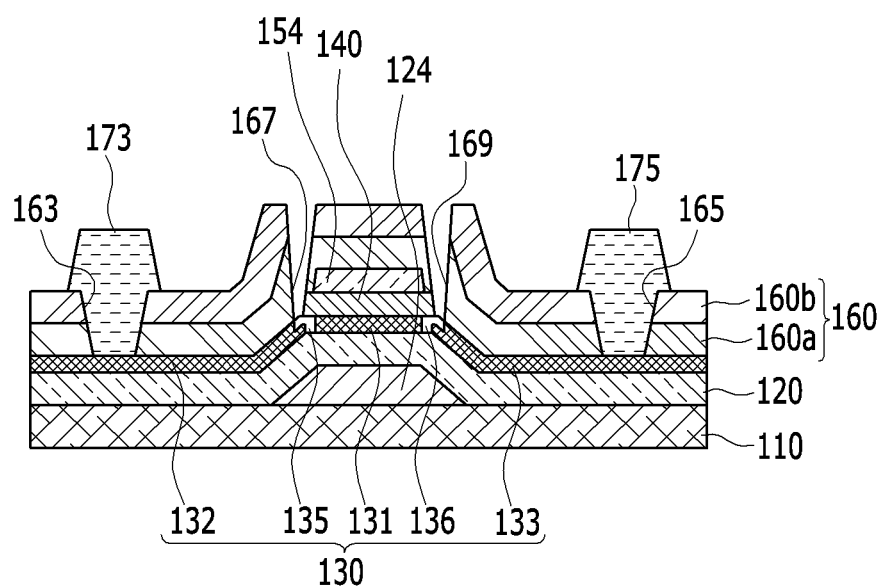

Referring to FIG. 13, the remaining part of the photoresist 700 is entirely removed. By depositing and patterning the metal material on the passivation layer 160, the source electrode 173 and drain electrode 175 are formed. The source electrode 173 is connected to the source region 132 of the semiconductor 130 through the first contact hole 163, and the drain electrode 175 is connected to the drain region 133 of the semiconductor 130 through the second contact hole 165.

In an embodiment, the first dummy hole 167 and the second dummy hole 169 are first provided in the passivation layer 160, the semiconductor 130 is treated by the oxygen plasma process or is heat-treated under the oxygen atmosphere, and then the first contact hole 163 and the second contact hole 165 are provided in the passivation layer 160. In an embodiment, during the oxygen plasma process or the heat treatment process under the oxygen atmosphere, the first contact hole 163 and the second contact hole 165 are not formed. In an embodiment, the first dummy hole 167, the second dummy hole 169, the first contact hole 163, and the second contact hole 165 may be simultaneously formed in the passivation layer 160. In an embodiment, during the oxygen plasma process or the heat treatment under the oxygen atmosphere, the first contact hole 163 and the second contact hole 165 may be formed. In an embodiment, the doping concentration of the portion of the semiconductor 130 exposed by the first contact hole 163 and the second contact hole 165 may also decrease. In an embodiment, since the portion of the semiconductor 130 exposed by the first contact hole 163 is connected to the source electrode 173, and the portion of the semiconductor 130 exposed by the second contact hole 165 is connected to the drain electrode 175, even if the doping concentration decreases, the thin film transistor may still normally operate.

While example embodiments have been described, practical embodiments are not limited to the described embodiments, but cover various modifications and equivalent arrangements defined within the spirit and scope of the appended claims.

What is claimed is:

1. A thin film transistor array panel comprising:
   a substrate;
   a first gate electrode positioned on a face of the substrate;
   a semiconductor positioned on the first gate electrode and including a channel region, a source region and a drain region respectively positioned at opposite sides of the channel region, a first lightly doped region positioned between the channel region and the source region, and a second lightly doped region positioned between the channel region and the drain region, wherein a first side of the first lightly doped region is opposite a second side of the first lightly doped region and is positioned between the substrate and the second side of the first lightly doped region, and wherein the second side of the first lightly doped region is wider than the first side of the first lightly doped region in a direction parallel to the face of the substrate;
   a second gate electrode positioned on the semiconductor;
   a source electrode connected to the source region of the semiconductor; and
   a drain electrode connected to the drain region of the semiconductor.

2. The thin film transistor array panel of claim 1, further comprising: a gate insulating layer positioned between the semiconductor and the second gate electrode and partially exposing the second side of the first lightly doped region.

3. The thin film transistor array panel of claim 1, wherein the semiconductor includes an oxide semiconductor material, and wherein the first gate electrode includes polysilicon.

4. The thin film transistor array panel of claim 3, wherein the semiconductor includes a crystallized surface.

5. The thin film transistor array panel of claim 1, further comprising:
- a passivation layer positioned on the semiconductor and the second gate electrode;
- a first contact hole formed in the passivation layer and exposing the source region of the semiconductor;
- a second contact hole formed in the passivation layer and exposing the drain region of the semiconductor;
- a first dummy hole formed in the passivation layer and exposing the first lightly doped region of the semiconductor; and
- a second dummy hole formed in the passivation layer and exposing the second lightly doped region of the semiconductor.

6. The thin film transistor array panel of claim 5, wherein the source electrode is connected to the source region of the semiconductor through the first contact hole, and the drain electrode is connected to the drain region of the semiconductor through the second contact hole.

7. The thin film transistor array panel of claim 5, wherein the first and second lightly doped regions are positioned adjacent to a surface of the semiconductor.

8. A thin film transistor array panel comprising:
- a substrate;
- a semiconductor positioned on the substrate and including a channel region, a source region and a drain region respectively positioned at opposite sides of the channel region, a first lightly doped region positioned between the channel region and the source region, and a second lightly doped region positioned between the channel region and the drain region;
- a gate electrode positioned on the semiconductor;
- a passivation layer positioned on the semiconductor and the gate electrode;
- a first contact hole formed in the passivation layer and exposing the source region of the semiconductor;
- a second contact hole formed in the passivation layer and exposing the drain region of the semiconductor;
- a first dummy hole formed in the passivation layer and exposing the first lightly doped region of the semiconductor;
- a second dummy hole formed in the passivation layer and exposing the second lightly doped region of the semiconductor;
- a source electrode connected to the source region of the semiconductor through the first contact hole; and
- a drain electrode connected to the drain region of the semiconductor through the second contact hole.

9. The thin film transistor array panel of claim 8, wherein the first and second lightly doped regions are positioned adjacent to a surface of the semiconductor.

10. The thin film transistor array panel of claim 8, wherein the semiconductor is made of an oxide semiconductor material, and
the semiconductor includes a crystallized surface.

* * * * *